United States Patent [19]

Chappell et al.

[11] 4,295,002
[45] Oct. 13, 1981

[54] HETEROJUNCTION V-GROOVE MULTIJUNCTION SOLAR CELL

[75] Inventors: Terry I. Chappell, Amawalk; Jerry M. Woodall, Bedford Hills, both of N.Y.

[73] Assignee: International Business Machines Corporation, Armonk, N.Y.

[21] Appl. No.: 161,820

[22] Filed: Jun. 23, 1980

[51] Int. Cl.³ .......................................... H01L 31/06
[52] U.S. Cl. .................................. 136/244; 136/255; 136/261; 136/262; 357/30
[58] Field of Search ............... 136/244, 246, 249, 255, 136/261, 262; 357/30

[56] References Cited

U.S. PATENT DOCUMENTS

| | | | |
|---|---|---|---|
| 3,990,101 | 11/1976 | Ettenberg et al. | 357/30 |
| 3,995,303 | 11/1976 | Nahory et al. | 357/30 |
| 4,017,332 | 4/1977 | James | 136/262 X |
| 4,094,704 | 6/1978 | Milnes | 136/244 |
| 4,158,577 | 6/1979 | Milnes | 136/262 X |
| 4,200,472 | 4/1980 | Chappell et al. | 136/246 |

OTHER PUBLICATIONS

T. Katoda et al., "Heteroepitaxial Growth of Gallium Phosphide on Silicon", *J. Electronic Materials*, vol. 9, pp. 783–796 (1980).

A. K. Sreedhar et al., "Efficiency Calculations of Heterojunction Solar Energy Converters", *IEEE Trans. Electron Devices*, vol. ED-16, pp. 309–312 (1969).

*Primary Examiner*—Aaron Weisstuch
*Attorney, Agent, or Firm*—Bernard N. Wiener

[57] ABSTRACT

A solar cell is disclosed with V-grooves which are series connected, but electrically isolated, indirect bandgap solar cells which are responsive to different light frequencies on both sides of a semi-insulating optically transparent substrate. The device has a very high conversion efficiency of approximately 40% and high open-circuit voltage and low series resistance. An exemplary structure in accordance with this disclosure has a series of silicon V-groove cells on one side and another series of GaAlAs V-groove cells on the other side. The cells are of generally trapezoidal cross-section. The difference between the characteristics of the Si cell and the GaAlAs cell is matched by control of the number of V-grooves.

17 Claims, 5 Drawing Figures

HETEROJUNCTION V-GROOVE MULTIJUNCTION SOLAR CELL

TECHNICAL FIELD OF THE INVENTION

This invention relates to solar cells and more particularly it relates to solar cells with a tandem structure.

RELATED PATENT APPLICATION

Patent Application Ser. No. 161,816 by H. Hovel, which is commonly assigned and was filed simultaneously herewith, discloses and claims related technology. The invention thereof is applicable for practice with invention hereof. Illustratively, features of Ser. No. 161,816 which may be included herewith are: a reflective metallic layer and conductive coupling of the cells in tandem to enhance efficiency of conversion from solar energy to electrical energy.

BACKGROUND OF THE INVENTION

It has previously been shown that high efficiency concentrator solar cells of Si and GaAs can be realized.

An article, "The V-groove Multijunction Solar Cell", by Terry I. Chappell published in IEEE Transactions on Electron Devices, Vol. ED-26, No. 7, July 1979, describes a type of silicon photovoltaic converter which has been termed a V-Groove multi-junction solar cell. A related U.S. Pat. No. 4,200,472 to Terry I. Chappell et al filed June 5, 1978 and issued Apr. 29, 1980, provides similar disclosure of technology. The solar cell consists of an array of many individual diode elements connected in series to produce a high voltage, low current output. All the elements of the cell are formed simultaneously from a single wafer by V-groove etching. Based on results of detailed simulations by computer, a conversion efficiency is predicted in excess of 24% for this cell when it is operated in sunlight after it has been concentrated approximately 100 or more times. The advantages of this cell over other silicon cells include: capability for greater than 20% conversion efficiency with only modest bulk carrier lifetimes, a higher open-circuit voltage, a very low series resistance, a simple one-mask fabrication procedure, and excellent environmental protection provided by a front surface of glass.

U.S. Pat. No. 4,128,133 shows a solar cell configuration with a flat III-V direct bandgap cell on one side of an insulating substrate and a flat IV direct bandgap cell on the other side.

OBJECTS OF THE INVENTION

It is an object of this invention to use GaP heterojunctions in silicon solar cells to obtain high open-circuit voltages.

It is another object of this invention to obtain angled deposition and growth of GaP on V-groove silicon solar cells, with generally trapezoidal cross-section.

It is another object of this invention to provide for high open-circuit voltage and high conversion efficiency of silicon solar cells.

It is another object of this invention to provide tandem, electrically isolated, heterojunction, V-groove multijunction, low current, and high voltage concentrator solar cells.

It is another object of this invention to provide a monolithic tandem cell structure of GaAlAs-GaP (semi-insulating)-Si.

It is another object of this invention to provide a multijunction GaAlAs cell with V-groove interconnection regions, each cell being of generally trapezoidal cross-section.

It is another object of this invention to provide either an angled molecular beam epitaxy or an ion-implantation on V-groove GaAlAs surfaces for use in a solar cell structure.

It is another object of this invention to provide semiconductor material having high carrier lifetime and high optical absorption for use in a solar cell.

SUMMARY OF THE INVENTION

A solar energy converter of this invention has: a region of a first semiconductor material responsive to light of a first frequency, a first quantity of grooved p-n junctions, a region of a second semiconductor material responsive to light of a frequency different from the first frequency, and a second quantity of grooved p-n junctions. The first quantity of junctions and the second quantity of junctions are operable to provide comparable electrical characteristics from the p-n junctions in the first and the second semiconductor materials. The first and second regions are contiguous with and separated by a substrate which has electrical isolation properties and is optically transparent to light at least of the second frequency.

Practice of this invention provides a solar cell with V-grooved diode elements which are series connected, but electrically isolated, indirect bandgap solar cells which are responsive to different light frequencies on both sides of a semi-insulating optically transparent substrate. The device has: very high efficiency of at least approximately 40+%, high open-circuit voltage, and low series resistance. An exemplary structure has: a Si cell comprising a series of silicon V-groove diode elements on one side and a GaAlAs cell comprising a series of GaAlAs V-groove diode elements on the other side. The difference between the characteristics of the Si cell and the GaAlAs cell is matched by control of the number of V-grooves.

PRACTICE OF THE INVENTION

It has previously been shown that high efficiency concentrator solar cells of Si and GaAs can be realized. This invention presents a structure for realizing a very high efficiency concentrator cell in which a tandem cell is made. Practice of the invention solves the problem of low efficiency in tandem solar cells in which the different cells are not electrically isolated. The structure of this invention allows electrical isolation to be achieved easily.

An exemplary computed conversion efficiency of a heterojunction V-groove multijunction solar cell made from silicon (bulk regions) and GaP (heterojunction regions) is approximately 30% at 300 suns. The best silicon solar cells of any design in the prior art practice have not obtained conversion efficiencies in excess of 21% in concentrated sunlight of any intensity. Hence, the heterojunction V-groove multijunction solar cell of this invention, which can be fabricated using existing technology, obtains a conversion efficiency in excess of that obtained in silicon solar cells of prior art design.

A multijunction solar cell is improved by growing GaP regions on selected faces of a V-groove silicon structure. In the practice of this invention n-type and p-type GaP heterojunctions are used in a silicon V-groove multijunction solar cell. Illustratively, the GaP regions are grown on selected faces of the V-groove silicon structure by angled deposition of GaP using molecular beam epitaxy technique. The large bandgap of GaP (2.25 eV) relative to the bandgap of silicon (1.12 eV) obtains very high emitter efficiency of the n-type and p-type collection regions of the V-groove cell. Thus, emitter degradation which normally occurs in homojunction silicon solar cells at high sunlight concentration factors and/or high bulk carrier lifetimes, is avoided in the double heterojunction solar cell of this invention.

BRIEF DESCRIPTION OF THE DRAWINGS

FIGS. 2-1 to 2-3 show major fabrications steps for the solar cell of FIG. 1.

PREFERRED EMBODIMENT OF THE INVENTION

Figure 3:
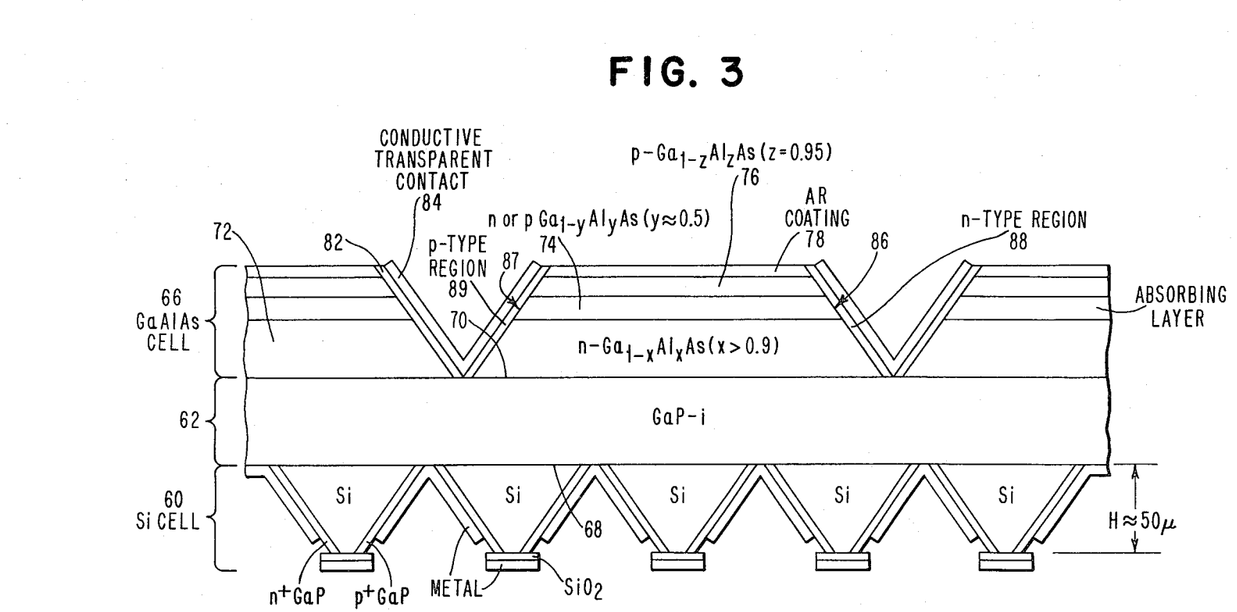
FIG. 3 shows an embodiment of the solar energy converter of this invention which has: a region of a first semiconductor material responsive to light of a first frequency, a first quantity of V-groove p-n junctions, a region of a second semiconductor material responsive to light of a frequency different from the first frequency, and a second quantity of V-groove p-n junctions.

The structure of a solar cell embodiment of this invention is shown schematically in FIG. 3. Basically, it comprises a grooved multijunction GaAlAs cell fabricated on a semi-insulating substrate of GaP with a grooved multijunction silicon solar cell fabricated on the bottom surface of the same GaP substrate.

Multijunction cells of the prior art are described in: "The V-groove Multijunction Solar Cell", by T. I. Chappell, IEEE Transactions on Electron Devices, Vol. ED-26, No. 7, July 1979; U.S. Pat. No. 4,062,698 by H. Hovel et al; and IBM Technical Research Bulletin, Vol. 20, p. 1612, September 1977.

In the structure of FIG. 3, passivation of the long base of the silicon trapezoidal elements is provided by a GaP-Si heterojunction. Passivation of the short base of these elements is provided by $SiO_2$ in accordance with the aforesaid prior art.

The GaAlAs layers are grown in a graded fashion on the semi-insulating GaP substrate using molecular-beam-epitaxy or liquid-phase-epitaxy to eliminate surface states, as described in Applied Physics Letters, Vol. 20, No. 10, May 15, 1972, p. 375 by J. M. Woodall et al. The grooves in the GaAlAs layers are formed by preferential etching and the doping on the faces of the resulting grooves is accomplished by angled ion-implantation or angled molecular-beam-epitaxy growth as described in the noted article by T. I. Chappell. The silicon layer is also grown in a graded fashion using the molecular-beam-epitaxy technique to eliminate interface states. The remaining fabrication steps for the silicon multijunction cell are as given in the noted article by T. I. Chappell.

The tandem GaAlAs-Si solar cell of this invention obtains a high conversion efficiency in excess of 40%. Because the two cells which comprise it are electrically isolated, matching of their short-circuit currents is not required. Hence, the tandem cell of this invention will maintain a high conversion efficiency under varying air mass conditions such as occur during sunset, sunrise, and on partially cloudy days.

Figure 1:
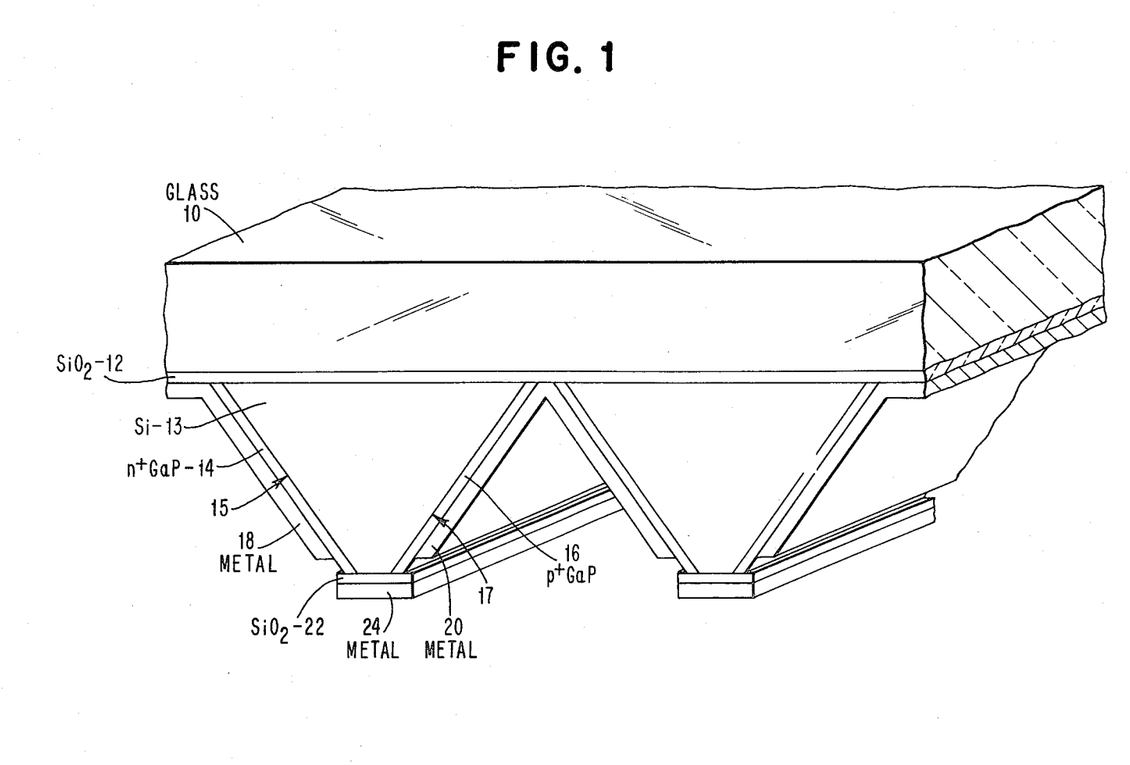
FIG. 1 is a sketch of the silicon double heterojunction V-groove multijunction solar cell used for the practice of this invention.

Referring to FIG. 1, a plurality of silicon semiconductor bodies 13 having longitudinal sides 15 and 17, respectively, are provided on a transparent insulating substrate 10. The body 13 may be a separate [100] crystallographic oriented wafer that is bonded to the substrate 10 at a region 12 that may be an oxide. The sides 15 and 17 will etch more rapidly in a preferential etchant along the [100] crystallographic orientation under these conditions, thereby exposing [111] crystallographic faces which will be sloping as shown.

The semiconductor body 13 is either undoped or lightly doped with conductivity type determining impurities. An etching mask, such as an oxide layer 22, which initially provided for the dimension control of the etching of the body 13 from the starting silicon wafer, covers the top of the body 13. The sides 15 and 17 of body 13 are undercut. Illustratively, a region of n-conductivity type gallium phosphide 14 is provided along side 15. Similarly, a region of p-conductivity type gallium phosphide 16 is provided along side 17. The GaP regions 14 and 16 may be formed by angled molecular beam epitaxial deposition. A discontinuous metal layer, e.g., of aluminum, is then provided by vacuum deposition. The metal layer is in three parts 18, 20, 24 due to the undercut of oxide layer 22. It provides electrical contact between the n-type and p-type gallium phosphide regions on adjacent silicon bodies. In addition, the discontinuous metal layer provides an optically reflecting cover for the sunlight being converted in the body 13.

Figure 21:
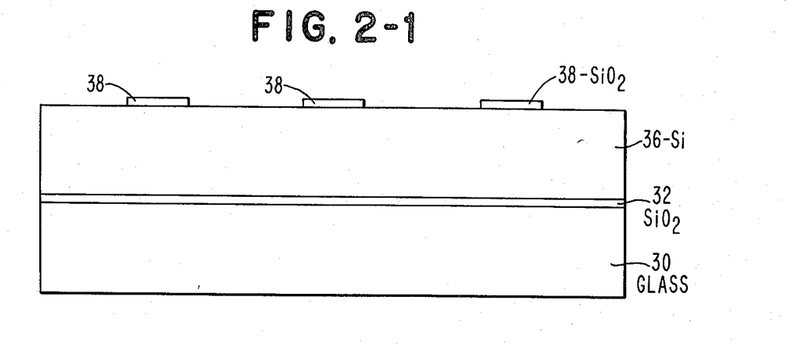

FIG. 2 illustrates the fabrication steps for the heterojunction V-groove multijunction solar cell of FIG. 1. FIG. 2-1 shows a silicon wafer 36 having [100] crystallographic orientation joined to a transparent insulating substrate 30, such as Corning type 7070 glass, at an oxide layer 32. An oxide etching mask 38 provides dimensional control over the preferential etching of silicon wafer 36. Oxide layers 38 and 32 can be formed on silicon wafer 36 by thermal oxidation.

Figure 22:
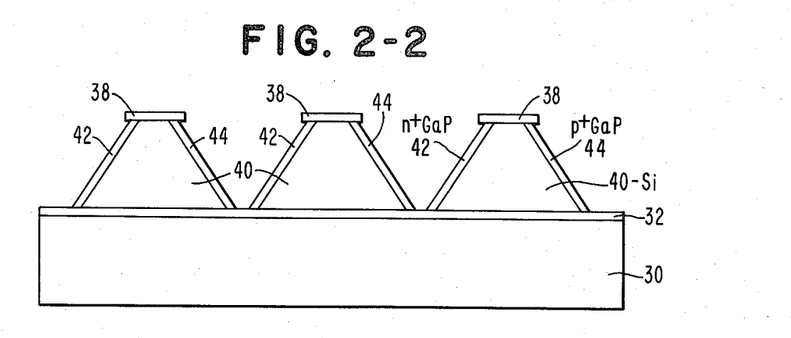

In FIG. 2-2, silicon wafer 36 has been preferentially etched down to oxide layer 32 to form electrically isolated silicon bodies 40 having [111] crystallographic oriented longitudinal sides. A layer of n-conductivity type GaP 42 is deposited on the left hand longitudinal sides of the bodies 40 by angled molecular-beam-epitaxial deposition. Similarly, p-conductivity type GaP 44 is deposited on the right hand longitudinal sides of the bodies 40.

Figure 23:
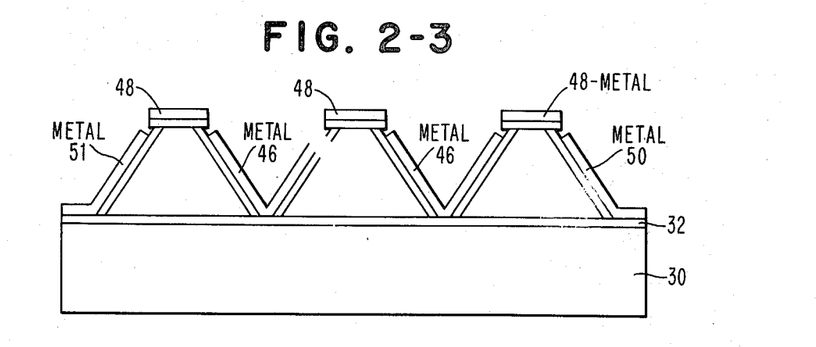

FIG. 2-3 displays a finished heterojunction V-groove multijunction solar cell with electrical contact between the n-conductivity type GaP and the p-conductivity type GaP regions on adjacent silicon bodies provided by a metal layer consisting of layers 46, 48 and 50. Metal layer 48 provides an optically reflecting cover for oxide layer 38.

FIG. 3 illustrates the tandem GaAlAs-Si grooved solar cell provided for the practice of this invention. The GaAlAs grooved solar cell 66 comprises a plurality of GaAlAs semiconductor bodies, having longitudinal sides 86 and 87, established on a semi-insulating GaP substrate 62 having a large bandgap (2.25 eV). The GaAlAs bodies have three coplanar layers of GaAlAs 72, 74 and 76, grown by liquid phase epitaxy, chemical vapor deposition, or molecular-beam-epitaxy in a graded fashion to eliminate surface states at the GaAlAs-GaP interface 70. An antireflection coating 78 provides efficient coupling of sunlight into the GaAlAs bodies.

GaAlAs layer 76 is comprised of p-type $Ga_{0.05}Al_{0.95}As$ of 0.1 micrometer ($\mu$m) thickness and with a direct bandgap of 3.0 eV for high optical transparency and low absorption. GaAlAs layer 72 is comprised of n-type $Ga_{0.1}Al_{0.9}As$ of 10 $\mu$m thickness and with a 2.8 eV direct bandgap for high optical transparency to photons having less than 1.95 eV energy. GaAlAs layers 76 and 72 form heterojunctions on either side of the $Ga_{0.5}Al_{0.5}As$ absorbing layer 74 which has a 1.95 eV indirect bandgap, 3 $\mu$m thickness, and is lightly doped with either n-type or p-type conductivity determining impurities. These heterojunctions provide a high emitter efficiency of the p-type and n-type GaAlAs collection regions 76 and 72 of the GaAlAs solar cell 66. In conjunction with the indirect bandgap of absorbing layer 74, regions 76 and 72 lead to a high open-circuit voltage and high conversion efficiency of the GaAlAs solar cell 66. Absorbing indirect bandgap layer 74 gives a higher carrier lifetime than with direct bandgap materials.

The n-type and p-type GaAlAs regions 88 and 89 are comprised of $Ga_{0.05}Al_{0.95}As$ of 0.1 $\mu$m thickness with a direct bandgap of 3.0 eV. They are formed by angled molecular-beam-epitaxial deposition along longitudinal sides 86 and 87 to provide electrical contact with n-type and p-type GaAlAs regions 72 and 76 respectively. Electrical contact between the n-type and p-type $Ga_{0.05}Al_{0.95}As$ regions of adjacent GaAlAs bodies is provided by a transparent conductive contact 84, such as indium-tin oxide.

The silicon multijunction V-groove solar cell 60 is as described in regard to FIGS. 1 and 2 except that (1) the silicon bodies 13 are formed from a silicon layer grown on the semi-insulating GaP substrate 62 by molecular-beam-epitaxy or chemical vapor deposition in a fashion to eliminate surface states at the Si-GaP interface 68, and (2) the passivating oxide layer 12 has been replaced by a GaP-Si heterojunction. Alternatively, the semi-insulating GaP layer 62 can be grown on the silicon body 13 by molecular-beam-epitaxy or chemical vapor deposition. The silicon solar cell 60 has a height dimension H of approximately 50 $\mu$m, which is chosen to be large enough to absorb most photons in sunlight having an energy less than the bandgap of the $Ga_{0.5}Al_{0.5}As$ absorbing layer 74 of the GaAlAs solar cell 66 (1.95 eV) and greater than the bandgap of silicon (1.12 eV).

The output of the GaAlAs solar cell 66 can be matched to that of the silicon solar cell 60 by varying the periodicity of the members of one or both of the solar cells so that the operating voltages of the two solar cells are equal. This allows the output current of the two solar cells to be added in parallel. Thus, the tandem solar cell of this invention will maintain a high operating efficiency under varying air mass conditions such as occur on cloudy days and during sunrise and sunset.

FEATURES OF THE INVENTION

The tandem GaAlAs-Si V-groove solar cell of FIG. 3 utilizes indirect bandgap semiconductor materials for the absorbing layers and heterojunctions for the collection regions of both solar cells. Therefore, the maximum obtainable conversion efficiency is limited by Auger recombination in the absorbing layers, rather than by band-to-band recombination as with direct bandgap semiconductor materials, or than by loss of emitter efficiency of the collection regions as in solar cells employing homojunction collection regions. The indirect bandgap semiconductor materials for the absorbing layers and heterojunctions for the collection regions gives the tandem GaAlAs-Si V-groove solar cell of this invention a higher obtainable conversion efficiency than in prior art tandem solar cells.

Ternary semiconductor material, having one component with an indirect bandgap (AlAs) and one component with a direct bandgap (GaAs), is used for the absorbing layer of a solar cell in a tandem solar cell. The composition of the ternary material is chosen to yield an indirect bandgap (e.g., 1.95 eV for $Ga_{0.5}Al_{0.5}As$) which is slightly lower in energy than its direct bandgap, e.g., 2.05 eV for $Ga_{0.5}Al_{0.5}As$. This allows the carrier lifetime of the material to be long, due to its indirect bandgap lying lower in energy than its direct bandgap.

Further, it has a high optical absorption of photons in sunlight, as in direct bandgap semiconductor materials, due to its direct bandgap lying only slightly higher in energy than its indirect bandgap. The ternary material also permits a very high carrier concentration to be obtained because only a thin layer of material is needed, e.g., 3 $\mu$m, to absorb most of the photons in sunlight with energy above its indirect bandgap and because the carrier lifetime of the material is high. Consequently, the open-circuit voltage of the solar cell 66 of FIG. 3 is very high, and its conversion efficiency is high.

The GaP heterojunctions for both the n+ and p+ collection regions of a silicon solar cell can be applied with single sided processing of the silicon cell without using photolithography. The V-groove geometry permits application of the GaP heterojunctions by angled deposition.

The voltage outputs of the two cells in the tandem solar cell can be matched so their current outputs may be added together efficiently in parallel. By varying the periodicity of one or both of the V-groove solar cells, the operating voltage of the two cells can be matched to each other. Parallel operation of the cells results in a high operating efficiency under conditions of changing spectral energy content of the sunlight illuminating the tandem solar cell, such as occurs on cloudy days and at sunrise and sunset each day.

The tandem solar cell of this invention can provide two electrically isolated, high voltage outputs of different values, which may be used to operate two independent loads at high efficiency. Since the voltage outputs of the two cells in the tandem solar cell of this invention can be tailored by varying the periodicity of the V-grooves and are electrically isolated, the voltages can be designed to meet the operating requirements of two different electrical loads. Illustratively, one output could be used to charge 24 volt storage batteries and the second output could be used to power a 100 volt pumping motor.

DICTIONARY OF ELEMENTS IN FIGURES

FIG. 1

10 is a transparent insulating substrate, such as Corning type 7070 glass. 12 is an oxide layer for passivation of the surface of body 13 joined to substrate 10. 13 is a silicon semiconductor body that has been formed by preferential etching. 14 is a n-conductivity type gallium phospide layer on side 15 of body 13. 15 is the left hand longitudinal side of body 13. 16 is a p-conductivity type gallium phosphide layer on side 17 of body 13. 17 is the right hand longitudinal side of body 13. 18 is a metal layer for contacting the n-conductivity type GaP layer 14. 20 is a metal layer for contacting the p-conductivity type GaP layer 16. 22 is an oxide layer which provides dimensional control in the etching of body 13. 24 is a metal layer that provides an optically reflecting cover for oxide layer 22.

FIG. 2-1

30 is a transparent insulating substrate (such as Corning type 7070 glass). 32 is an oxide layer for passivation of the lower surface of wafer 36. 36 is a [100] oriented silicon wafer which is lightly doped n- or p-type. 38 is an oxide layer which provides dimensional control in the etching of wafer 36.

FIG. 2-2

30 is a transparent insulating substrate, such as Corning type 7070 glass. 32 is an oxide layer for passivation of the lower surface of wafer 36. 38 is an oxide layer which provides dimensional control in the etching of wafer 36. 40 is a silicon semiconductor body that has been formed by preferential etching. 42 is an n-type conductivity gallium-phosphide layer on the left hand longitudinal side of body 40. 44 is a p-conductivity type gallium-phosphide layer on the right hand longitudinal side of body 40.

FIG. 2-3

30 is a transparent insulating substrate, such as Corning type 7070 glass. 32 is an oxide layer for passivation of the lower surface of wafer 36. 46 is a metal layer for interconnecting the n- and p-type conductivity GaP layers 42 and 44 respectively. 48 is a metal layer that provides an optically reflecting cover for oxide layer 38. 50 is a metal layer for contacting the p-conductivity type GaP layer 44. 51 is a metal layer for contacting the n-conductivity type GaP layer 42.

FIG. 3

60 is the V-groove silicon solar cell of FIG. 1 specified by elements 13 through 24. 62 is a GaP semi-insulating substrate which provides mechanical support of 60 and 66. 66 is a V-groove GaAlAs solar cell. 68 is the interface between the silicon bodies 13 and the GaP substrate 62. 70 is the interface between GaAlAs layer 72 and the GaP substrate 62. 72 is a n-conductivity type $Ga_{0.1}Al_{0.9}As$ layer 10 μm thick with a 2.8 eV direct bandgap. 74 is a lightly doped n- or p-type $Ga_{0.5}Al_{0.5}As$ layer 3 μm thick with a 1.95 eV indirect bandgap. 76 is a p-conductivity type $Ga_{0.05}Al_{0.95}As$ layer 0.1 μm thick with a 3.0 eV bandgap. 78 is an antireflection coating for efficient coupling of a sunlight into layer 76. 82 is the right hand longitudinal side of the GaAlAs body consisting of layers 72, 74, 76, and 78 (which is optional). 84 is a conductive transparent contact for interconnecting adjacent GaAlAs bodies. 86 is the right hand longitudinal side of the GaAlAs body comprising layers 72, 74, 76. 87 is the left hand longitudinal side of the GaAlAs body comprising layers 72, 74, 76. 88 is a n-conductivity type $Ga_{0.05}Al_{0.95}As$ layer for making electrical contact to n-conductivity type $Ga_{0.1}Al_{0.9}As$ layer 72. 89 is a p-conductivity type $Ga_{0.05}Al_{0.95}As$ layer for making electrical contact to p-conductivity type $Ga_{0.05}Al_{0.95}As$ layer 76.

CALCULATIONS FOR THE INVENTION

The conversion efficiency of the GaAlAs-Si tandem cell of this invention operating in concentrated sunlight can be estimated from the power outputs of the individual cells, taking into account the absorption of the GaAlAs layers which precede the Si cell. Their power output is given by the product of their short-circuit current, open-circuit voltage, and fill factor. For the case of the GaAlAs cell with an absorbing layer bandgap of 1.95 eV, the short-circuit current is about 16 mA/cm² in unconcentrated sunlight (reference FIG. 20 in "Semiconductors and Semi-metals, Volume 11 "Solar Cells", by H. Hovel, Academic Press, 1975). Its open-circuit voltage is given by $V_{oc} = kT/q \ln(\Delta nP/n_i^2) = 1.84$ volts, where
$kT/q = 0.026$ V, $P = 1.E18$ cm$^{-3}$, $n_i^2 = 2.0E4$ cm$^{-6}$,
$\Delta n = \tau_n G_L$, $\tau_n = 1.E - 6$ sec., $G_L = X_c 16mA/cm^2(qW)$,
$W = 3.E - 4$ cm, and
$X_c$ (sunlight concentration factor) = 500.

Its fill factor would be 0.9 (reference FIG. 34 in the noted H. Hovel book). Thus, the GaAlAs power output at a sunlight concentration factor of 500 is $P_{GaAlAs} = 500 \times 16$ mA/cm$^2 \times 1.84$ v $\times 0.9 = 13.25$ watts/cm$^2$.

For the Si cell there is a short-circuit current of (40.5 mA/cm²−16 mA/cm²)=24.5 mA/cm² in unconcentrated sunlight (reference FIG. 20 in the noted H. Hovel book) and in the case where the bulk carrier lifetime is limited by Auger recombination (which is expected in the case of a heterojunction silicon cell), the open-circuit voltage is given by $V_{oc} = kT/q \ln (\Delta n \Delta p/n_i^2) = 0.889$ volts; where
$\Delta n = \Delta p = \tau G_L, \tau = 1./(\alpha \Delta n^2), \Delta n = (G_L/\alpha)^{\frac{1}{3}}$,
$n_i^2 = 2.1E20$ cm$^{-6}$, $G_L = X_c 24.5 mA/cm^2(qH/1.93)$,
$H = 50.E - 4$ cm, $\alpha = 3.8E - 31$ cm$^{-6}$, and $X_c = 500$.

In this case the fill factor is 0.8 (reference FIG. 34 in the noted H. Hovel book) and the silicon cell power output is:

$P_{Si} = 500. \times 24.5$ mA/cm$^2 \times 0.889$ v$\times 0.8 = 8.71$ watts/cm$^2$.

Therefore, the combined power output and efficiency of the GaAlAs-Si tandem cell is:

$P_{out} = 21.96$ watts/cm² tandem cell efficiency =
$P_{out}/P_{in} = 45.9\%$
and $P_{in} = 500. \times 95.6$ mW/cm² for air mass 1 sunlight.

The GaAlAs and Si solar cells used for the practice of this invention are multijunction solar cells which have wholly negligible series resistance losses. Therefore, in the calculation presented above, no provision was made for losses due to series resistance. Normally, series resistances are important when solar cells are operated in concentrated sunlight. Further, shadowing losses are essentially negligible because transparent electrodes are used on only a small part of the total device area, as shown in FIG. 3.

ASPECTS OF THE INVENTION

Aspect 1 of the invention is a solar energy converter comprising: a first solar cell comprising first multiple p-n heterojunctions in association with a first type of optically active semiconductor material on one side of an insulating substrate; and a second solar cell comprising second multiple p-n heterojunctions in association with a second type of optically active semiconductor material on the opposite side of the insulating substrate.

Aspect 2 of the invention is a solar energy converter as set forth in Aspect 1 wherein the first type of semiconductor material is GaAlAs, the second type of semiconductor material is Si, and the substrate is semi-insulating GaP.

Aspect 3 of the invention is a solar energy converter as set forth in Aspect 1 wherein: said first material A has indirect bandgap and carrier lifetime limited by Auger recombination, one side of A has a heterojunction between a material $A'_n$ which is doped n+ type conductivity and has a larger bandgap than A and is lattice matched to A, the other side of A has a heterojunction $A'_p$ doped p-type conductivity and has a larger bandgap than A and is lattice matched to A, an insulation layer adjacent to $A'_p$ whose bandgap is greater than or equal to A material and whose interfaces between cell 1 and cell 2 is atomically compatible respectively, said second material B has an indirect bandgap less than material A and carrier lifetime limited by Auger recombination, one side of B has a heterojunction of material $B'_n$ doped n-type conductivity and lattice matched with B, and the other side of B has heterojunction of material $B'_p$ doped p-type conductivity and lattice matched with B.

Aspect 4 of the invention is a solar energy converter as set forth in Aspect 3 wherein: said first material A is $Ga_{1-x}Al_xAs$ has indirect bandgap and carrier lifetime limited by Auger recombination, one side of A has a heterojunction of a material $A'_n$ (n-$Ga_{1-y}Al_yAs$) which is doped n+ type conductivity and has a larger bandgap than A and is lattice matched to A, the other side of A has a heterojunction of $A'_p$ (p-$Ga_{1-y}Al_yAs$) doped p-type conductivity and has a larger bandgap than A and is lattice matched to A, said insulating substrate is an insulation layer whose bandgap is greater than or equal to A material and whose interfaces between cell 1 and cell 2 is atomically compatible respectively, said second material B (Si) has an indirect bandgap less than material A, one side of B has a heterojunction of material $B'_n$ (n-GaP) doped n-type conductivity and lattice matched with B and other side of B has heterojunction of material $B'_p$ (p-GaP) doped p-type conductivity and lattice matched with B.

Aspect 5 of the invention is a solar energy converter as set forth in Aspect 4 wherein: said first material A has an indirect bandgap lying somewhat lower in energy than its direct bandgap, thereby having a high carrier lifetime and also having high optical absorption of photons slightly greater in energy than said indirect bandgap.

Aspect 6 of the invention is a solar energy converter as set forth in Aspect 5 wherein said material A is a ternary semiconductor material compound of an indirect bandgap semiconductor material and a direct bandgap semiconductor material.

Aspect 7 of the invention is a solar energy conversion as set forth in Aspect 6 wherein said material A is a group III-V ternary semiconductor material.

Aspect 8 of the invention is a solar energy converter as set forth in Aspect 7 wherein said first material A is $Ga_{1-x}Al_xAs$ and x is approximately 0.5.

Aspect 9 of the invention is a solar energy converter as set forth in Aspect 7 wherein A is $Ga_{1-x}Al_xAs$ and X is $0.4 \leq X \leq 0.6$.

Aspect 10 of the invention is a solar energy converter comprising: a region of a first semiconductor material which is responsive to light of a first frequency and having a first quantity of grooved p-n junctions, a region of a second semiconductor material which is responsive to light of a frequency different from said first frequency and having a second quantity of grooved p-n junctions, said first quantity of junctions and second quantity of junctions being operable to provide comparable electrical characteristics from the p-n junctions in said first and said second semiconductor materials, said first and second regions being contiguous with and separated by a substrate having electrical isolation properties and being optically transparent at least to light of said second frequency.

Aspect 11 of the invention is a solar energy converter comprising: a first material A having indirect bandgap being carrier lifetime limited by Auger recombination, one side of A has a heterojunction between a material $A'_n$ which is doped n+ type conductivity and has a larger bandgap than A and is lattice matched to A, the other side of A has a heterojunction $A'_p$ which is doped p-type conductivity and has a larger bandgap than A and is lattice matched to A.

Aspect 12 of the invention is a solar energy converter as set forth in claim 11 wherein said first material A has an indirect bandgap lying somewhat lower in energy than its direct bandgap thereby having a high carrier lifetime and also having high optical absorption of protons just slightly greater in energy than said indirect bandgap.

Aspect 13 of the invention is a solar energy converter as set forth in Aspect 12 wherein said material A is a ternary semiconductor material compound of an indirect bandgap semiconductor material and a direct bandgap semiconductor material.

Aspect 14 of the invention is a solar energy converter as set forth in Aspect 13 wherein said material A is a group III-V ternary semiconductor material.

Aspect 15 of the invention is a solar energy converter as set forth in Aspect 14 wherein said first material A is $Ga_{1-x}Al_xAs$ an x is approximately 0.5.

Aspect 16 of the invention is a solar energy converter as set forth in Aspect 14 wherein A is $Ga_{1-x}Al_xAs$ and x is $0.4 \leq X \leq 0.6$.

Aspect 17 of the invention is a solar energy converter comprising a semiconductor material A with indirect bandgap and being carrier lifetime limited by Auger recombination, one side of A has a heterojunction of semiconductor material $A_n$ doped n-type conductivity and another side of A has a heterojunction of semiconductor material $A_p$ which is doped p-type conductivity, said material $A_n$ and said material $A_p$ having a larger bandgap than said material A.

Aspect 18 of the invention is a solar energy converter as set forth in Aspect 17 wherein said semiconductor material A is silicon, said semiconductor material $A_n$ is gallium phosphide doped n-type conductivity, and said semiconductor material $A_p$ is gallium phosphide doped p-type conductivity.

Having thus described our invention, what we claim as new, and desire to secure by Letters Patent is:

1. A solar energy converter comprising:
   a first solar cell comprising first multiple p-n heterojunctions in association with a first type of optically active semiconductor material on one side of an insulating substrate; and
   a second solar cell comprising second multiple p-n heterojunctions in association with a second type of optically active semiconductor material on the opposite side of the insulating substrate;

said first type of semiconductor material is GaAlAs, said second type of semiconductor material is Si, and said insulating substrate is semi-insulating GaP.

2. A solar energy converter comprising:
a first solar cell comprising first multiple p-n heterojunctions in association with a first type of optically active semiconductor material A on one side of an insulating substrate; and
a second solar cell comprising second multiple p-n heterojunctions in association with a second type of optically active semiconductor material B on the opposite side of the insulating substrate;
wherein said material A has an indirect bandgap and carrier lifetime limited by Auger recombination,
one side of A has a heterojunction with a material $A_n'$ which is doped to n+ type conductivity, has a larger bandgap than A, and is lattice matched to A,
the other side of A has a heterojunction with a material $A_p'$ doped to p-type conductivity, and has a larger bandgap than A, and is lattice matched to A;
wherein said insulating substrate comprises an insulation layer adjacent to $A_p'$ whose bandgap is greater than or equal to the bandgap of said A material and whose interfaces between said first and second cells are atomically compatible;
and wherein said material B has an indirect bandgap less than material A and carrier lifetime limited by Auger recombination,
one side of B has a heterojunction with a material $B_n'$ doped to n-type conductivity and lattice matched with B, and
the other side of B has a heterojunction with a material $B_p'$ doped to p-type conductivity and lattice matched with B.

3. A solar energy converter as set forth in claim 2 wherein:
said first material A is $Ga_{1-x}Al_xAs$,
A'n is $n\text{-}Ga_{1-y}Al_yAs$,
A'p is $p\text{-}Ga_{1-y}Al_{1-y}As$,
said second material B is Si,
one side of B has a heterojunction with material $B_n'$ which is n-GaP and is lattice matched with B and
the other side of B has a heterojunction with material $B_p'$ which is p-GaP and is lattice matched with B.

4. A solar energy converter as set forth in claim 3 wherein:
said first material A has an indirect bandgap lying lower in energy than its direct bandgap, thereby having a high carrier lifetime and also having high optical absorption of photons slightly greater in energy than said indirect bandgap.

5. A solar energy converter as set forth in claim 4 wherein
said material A is a ternary semiconductor material compound of an indirect bandgap semiconductor material and a direct bandgap semiconductor material.

6. A solar energy converter as set forth in claim 5 wherein
said material A is a group III-V ternary semiconductor material.

7. A solar energy converter as set forth in claim 6 wherein
said first material A is $Ga_{1-x}Al_xAs$ and x is approximately 0.5.

8. A solar energy converter as set forth in claim 6 wherein A is $Ga_{1-x}Al_xAs$ and x is $0.4 \leq x \leq 0.6$.

9. A solar energy converter comprising:
a region of a first semiconductor material, which is responsive to light of a first frequency, having indirect bandgap and being carrier lifetime limited by Auger recombination, and having a first quantity of p-n heterojunctions with semiconductor material which has a larger bandgap than said first material and is lattice matched thereto.
a region of a second semiconductor material, which is responsive to light of a second frequency, having indirect bandgap and being carrier lifetime limited by Auger combination and having a second quantity of p-n heterojunctions with a semiconductor material which has a larger bandgap than said second material and is lattice matched thereto,
said first quantity of junctions and second quantity of junctions being operable to provide comparable electrical characteristics from the p-n heterojunctions in said first and said second semiconductor materials,
said first and second regions being conterminous with and separated by a substrate having
electrical isolation properties and
being optically transparent at least to light of said second frequency.

10. A solar energy converter having a
first material A having indirect bandgap and carrier lifetime limited by Auger recombination,
one side of A has a heterojunction with a material $A_n'$ which is doped to n+ type conductivity, has a larger bandgap than A, and is lattice matched to A,
the other side of A has a heterojunction with a material $A_p'$ which is doped to p-type conductivity, has a larger bandgap than A, and is lattice matched to A.

11. A solar energy converter as set forth in claim 10 wherein
said first material A has an indirect bandgap lying lower in energy than its direct bandgap thereby having a high carrier lifetime and also having high optical absorption of photons just slightly greater in energy than said indirect bandgap.

12. A solar energy converter as set forth in claim 11 wherein
said material A is a ternary semiconductor material compound comprised of an indirect bandgap semiconductor material and a direct bandgap semiconductor material.

13. A solar energy converter as set forth in claim 12 wherein
said material A is a group III-V ternary semiconductor material.

14. A solar energy converter as set forth in claim 13 wherein
said first material A is $Ga_{1-x}Al_xAs$ and x is approximately 0.5.

15. A solar energy converter as set forth in claim 13 wherein A is $Ga_{1-x}Al_xAs$ and x is $0.4 \leq x \leq 0.6$.

16. A solar energy converter having
a semiconductor material A with indirect bandgap and carrier lifetime limited by Auger recombination,
one side of A has a heterojunction with semiconductor material $A_n$ doped to n-type conductivity and another side of A has a heterojunction with a semiconductor material $A_p$ which is doped to p-type conductivity, said material $A_n$ and said material $A_p$ having a larger bandgap than said material A.

17. A solar energy converter as set forth in claim 16 wherein:

said semiconductor material A is silicon, said semiconductor material $A_n$ is gallium phosphide doped to n-type conductivity, and said semiconductor material $A_p$ is gallium phosphide doped to p-type conductivity.

* * * * *